United States Patent
Liu et al.

(10) Patent No.: US 11,611,334 B2
(45) Date of Patent: Mar. 21, 2023

(54) METHOD AND CIRCUIT FOR MONITORING AND CONTROLLING DUTY MARGIN OF A SIGNAL

(71) Applicant: MEDIATEK INC., Hsin-Chu (TW)

(72) Inventors: Shou-En Liu, Hsinchu (TW);
Wen-Sung Chiang, Hsinchu (TW);
Ming-Han Hsieh, Hsinchu (TW);
Keng-Jui Chang, Hsinchu (TW);
Lin-Chien Chen, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 17/504,485

(22) Filed: Oct. 18, 2021

(65) Prior Publication Data
US 2022/0166412 A1    May 26, 2022

Related U.S. Application Data (60) Provisional application No. 63/117,505, filed on Nov. 24, 2020.

(51) Int. Cl.
*H03K 3/017* (2006.01)
*H03M 13/25* (2006.01)
*G06F 1/08* (2006.01)

(52) U.S. Cl.
CPC .............. *H03K 3/017* (2013.01); *G06F 1/08* (2013.01); *H03M 13/25* (2013.01)

(58) Field of Classification Search
CPC ...... H03K 3/017; H03K 5/1565; H03K 5/135; H03K 19/21; H03K 5/133; H03K 5/26; H03K 3/0315; H03K 7/08; H03K 5/24; G06F 1/08; H03M 13/25; H03L 7/0812; H03L 7/087; H03L 7/18; H03L 7/0814; H03L 7/00; H03L 7/0816; H03L 7/091; H03L 7/08; H03L 7/085
USPC ................................ 327/172, 173, 174, 175
See application file for complete search history.

(56) References Cited

U.S. PATENT DOCUMENTS

| | | | |
|---|---|---|---|
| 2004/0161068 A1 | 8/2004 | Zerbe | |
| 2005/0285649 A1* | 12/2005 | Chun | H03K 5/1565 327/172 |
| 2008/0191757 A1* | 8/2008 | Choi | H03K 5/1565 327/175 |
| 2010/0039157 A1 | 2/2010 | Kaeriyama | |

(Continued)

FOREIGN PATENT DOCUMENTS

| WO | 2012/145117 A2 | 10/2012 |
|---|---|---|
| WO | 2012/145117 A3 | 1/2013 |
| WO | 2015/076789 A1 | 5/2015 |

*Primary Examiner* — John W Poos
(74) *Attorney, Agent, or Firm* — Winston Hsu (57) ABSTRACT

A duty margin monitoring circuit, coupled to a functional circuit which generates a first output signal in response to a target signal, includes a modulation circuit, a replica circuit and an error detection circuit. The modulation circuit is arranged to receive the target signal and modulate the target signal to generate a modulated target signal. The replica circuit is arranged to receive the modulated target signal and generate a second output signal in response to the modulated target signal. The error detection circuit is coupled to the functional circuit and the replica circuit to receive the first output signal and the second output signal and arranged to generate an error detection result according to the first output signal and the second output signal.

20 Claims, 7 Drawing Sheets

(56) References Cited

U.S. PATENT DOCUMENTS

| | | | |
|---|---|---|---|
| 2011/0102039 A1* | 5/2011 | Shin | H03L 7/0816 |
| | | | 327/175 |
| 2011/0267124 A1 | 11/2011 | Kim | |
| 2019/0181847 A1* | 6/2019 | Satoh | G11C 7/12 |

* cited by examiner

METHOD AND CIRCUIT FOR MONITORING AND CONTROLLING DUTY MARGIN OF A SIGNAL

CROSS REFERENCE TO RELATED APPLICATIONS

This application claims the benefit of U.S. Provisional Application No. 63/117,505 filed 2020 Nov. 24 and the entirety of which is incorporated by reference herein.

BACKGROUND

Signal processing circuits such as processors, memory devices, and input/output (I/O) devices typically communicate with each other using digital data signals and clock signals, where the clock signal is used at the receiving device to time the received data. Thus, clock signal is an important signal in signal processing field.

Duty cycle of a clock signal is defined as a fraction of a period of clock during which the clock is in active state. For some high-performance circuits that are toggled by the clock signal and require tight duty margin (also called as operational margin or duty cycle margin, which is a margin for the circuit to correctly function or correctly receive data), the duty cycle of the clock signal is a key factor that dominates the reliability of the circuits. However, the duty cycle of a clock signal is vulnerable to aging of the circuit components, the signal transmission distance or some process variations.

Therefore, designs of a circuit and the associated method for detecting duty cycle degradation are highly required.

SUMMARY

It is an objective of the invention to provide designs of a circuit and the associated method for detecting duty cycle degradation and adjust the duty margin or duty cycle of a signal when required, so as to avoid function failure of a circuit caused by duty cycle degradation.

According to an embodiment of the invention, a duty margin monitoring circuit coupled to a functional circuit which generates a first output signal in response to a target signal comprises a modulation circuit, a replica circuit and an error detection circuit. The modulation circuit is arranged to receive the target signal and modulate the target signal to generate a modulated target signal. The replica circuit is arranged to receive the modulated target signal and generate a second output signal in response to the modulated target signal. The error detection circuit is coupled to the functional circuit and the replica circuit to receive the first output signal and the second output signal and arranged to generate an error detection result according to the first output signal and the second output signal.

According to another embodiment of the invention, a method for monitoring a duty margin of a target signal comprising: providing the target signal to a functional circuit for the functional circuit to generate a first output signal in response to the target signal; modulating the target signal to generate a modulated target signal and providing the modulated target signal to a replica circuit for the replica circuit to generate a second output signal in response to the modulated target signal, wherein the replica circuit is a replica of functional circuit; and generating an error detection result according to the first output signal and the second output signal.

According to yet another embodiment of the invention, a circuit for monitoring and controlling a duty margin of a target signal comprises a plurality of circuit subunits, a collection circuit and a control circuit. Each circuit subunit comprises a functional circuit and a duty margin monitoring circuit. The functional circuit is arranged to receive the target signal and generate a first output signal in response to the target signal. The duty margin monitoring circuit is coupled to the functional circuit and arranged to monitor the duty margin of the target signal according to the first output signal to generate an error detection result. The collection circuit is coupled to the circuit subunits and arranged to collect the error detection results and generate a control signal according to the error detection results. The control circuit is coupled to the collection circuit and arranged to adjust the duty margin of the target signal according to the control signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
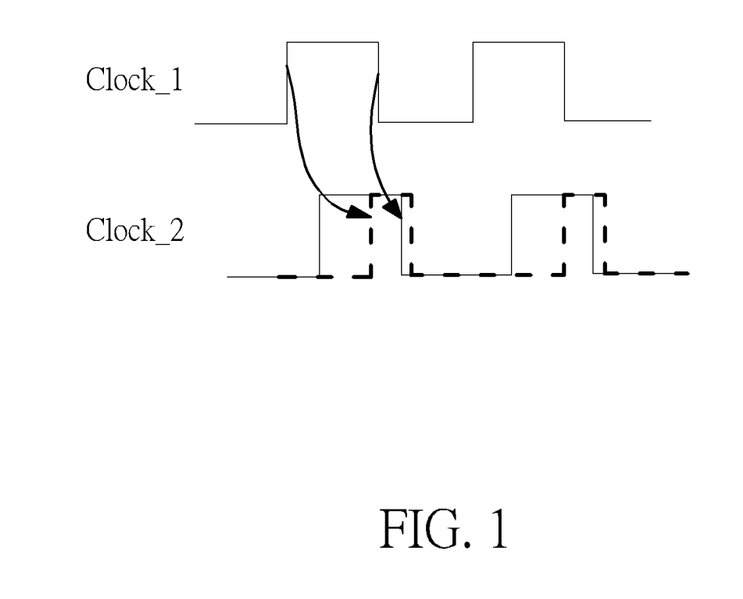
FIG. 1 shows exemplary waveforms of clock signals.

FIG. 1 shows exemplary waveforms of clock signals. The clock signal Clock_1 is the clock signal transmitted by a relatively short distance and the clock signal Clock_2 is the same clock signal transmitted by a relatively long distance. The solid line in the waveform of clock signal Clock_2 shows the original waveform of the clock signal before duty cycle degradation and the dotted line shows the resulting waveform with duty cycle degradation. As shown in FIG. 1, when the duty cycle of a clock signal starts to degrade, the pulse width of the clock signal becomes narrower.

When the clock signal is utilized as an active high signal, that is, the logical high state of the clock signal is recognized as an active state, the degradation in duty cycle narrows down the duty margin, which is the duration of the logical high state, of the clock signal. Here, the duty margin of the clock signal may be also called as operational margin or duty cycle margin, which is a margin for a circuit receiving the clock signal to correctly function or correctly receive data in response to the active state of the clock signal. To avoid function failure of a circuit caused by duty cycle degradation, in the following disclosure, designs of a circuit and the associated method for detecting duty cycle degradation of a target signal by monitoring the duty margin and further controlling the duty margin or duty cycle of the target signal when required are proposed. It should be noted that although long transmission distance is taken above as the example which causes duty cycle degradation, the invention should not be limited thereto. The proposed circuit and the associated method are also applicable to detect the duty cycle degradation caused by other reasons such as aging of the circuit components, process variations, or others.

Figure 2:
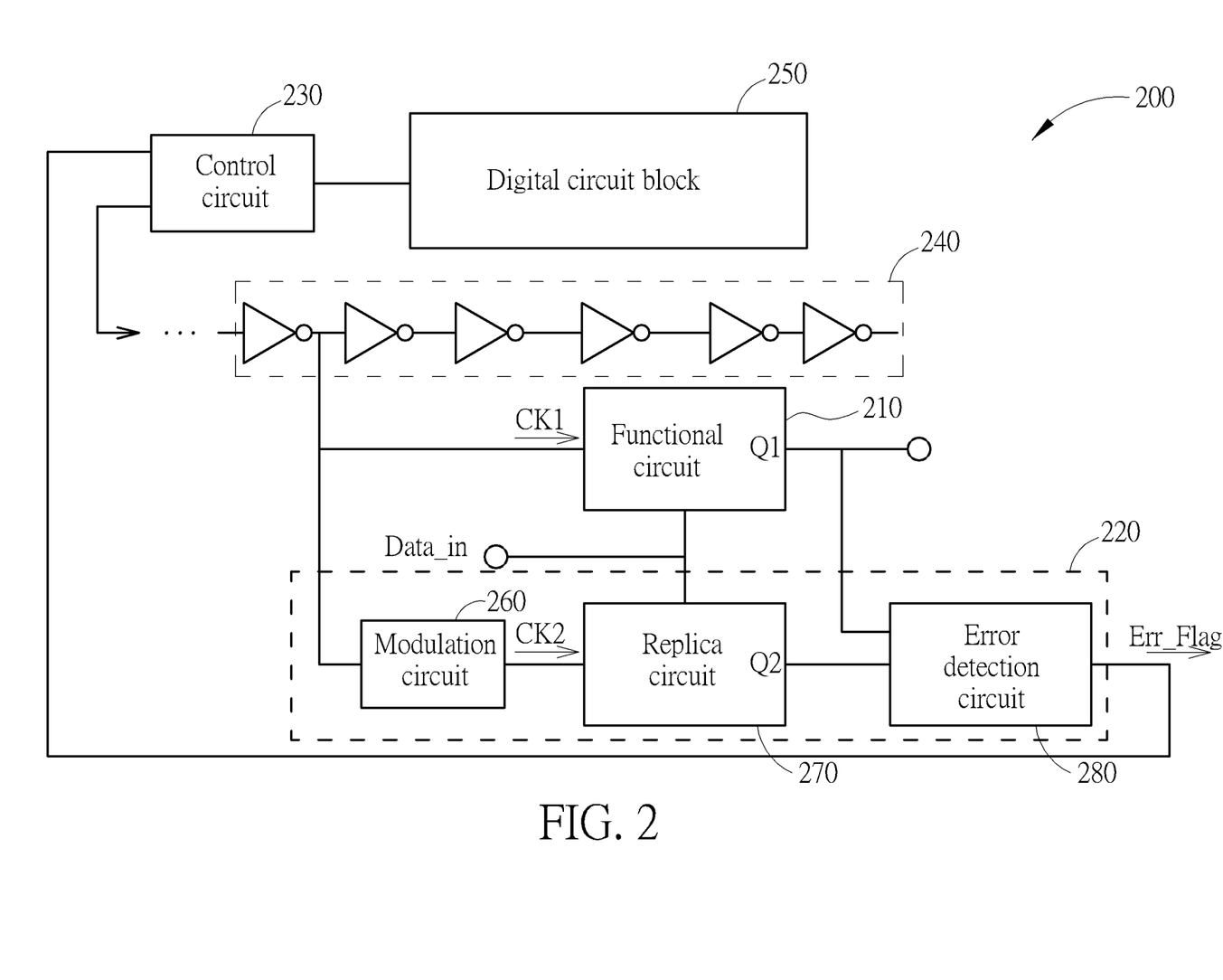
FIG. 2 shows an exemplary block diagram of a circuit for monitoring and controlling the duty margin of a signal according to an embodiment of the invention.

FIG. 2 shows an exemplary block diagram of a circuit for monitoring and controlling the duty margin of a signal according to an embodiment of the invention. The circuit 200 may at least comprise a functional circuit 210, a duty margin monitoring circuit 220 and a control circuit 230. In the embodiment of the invention, the circuit 200 is designed to monitor and control the duty margin of a target signal, where the duty margin monitoring circuit 220 is arranged to monitor the duty margin of the target signal by monitoring the signal output by the functional circuit 210 and the control circuit 230 is arranged to control the duty margin (or, in some embodiments, the duty cycle) of the target signal and provide the target signal to a delay chain 240 and a subsequent digital circuit block 250. According to an embodiment of the invention, the target signal may be a pulse signal comprising only one or at least one pulse, or may be a clock signal comprising a plurality of consecutive pulses.

The functional circuit 210 may receive the target signal, which may be a delayed version of the original target signal output by the control circuit 230, from the delay chain 240 and arranged to generate an output signal (e.g., a first output signal) in response to the target signal. For easy understanding, the label CK1 is given to the target signal provided to the functional circuit 210.

In the embodiments of the invention, the functional circuit 210 may be a duty sensitive cell which is sensitive to variation in duty margin or duty cycle of the target signal. For example, the functional circuit 210 may function failed or generate the first output signal having an erroneous waveform when the duty margin or duty cycle of the target signal CK1 is insufficient. In an embodiment of the invention, the functional circuit 210 is a memory circuit which is arranged to receive an input data signal and perform data sampling on the input data signal in response to the target signal CK1 to generate the first output signal. However, the invention should not be limited thereto. For easy understanding, the label Data_in is given to the input data signal provided to the functional circuit 210 and the label Q1 is given to the first output signal generated by the functional circuit 210.

According to an embodiment of the invention, the duty margin monitoring circuit 220 may comprise a modulation circuit 260, a replica circuit 270 and an error detection circuit 280. The modulation circuit 260 is arranged to receive the target signal CK1 and modulate the target signal CK1 to generate a modulated target signal. The replica circuit 270 is arranged to receive the modulated target signal and generate a second output signal in response to the modulated target signal. For easy understanding, the label CK2 is given to the modulated target signal provided to the replica circuit 270 and the label Q2 is given to the second output signal generated by the replica circuit 270.

According to an embodiment of the invention, the replica circuit 270 is a replica of functional circuit 210. That is, the replica circuit 270 may be designed to have the same circuit structure and operate in the same way as the functional circuit 210. In an embodiment of the invention, the replica circuit 270 is also a memory circuit as the functional circuit 210, and is arranged to receive the same input data signal Data_in and perform data sampling on the input data signal Data_in in response to the modulated target signal CK2 to generate the second output signal Q2, but the replica circuit 270 may be actually a dummy circuit. It is to be noted that in the embodiments of the invention, the functional circuit 210 and the replica circuit 270 are not be limited to be implemented as memory circuits.

According to an embodiment of the invention, the modulation circuit 260 may modulate the target signal CK1 by adjusting a pulse width of the target signal CK1. For example, in an embodiment of the invention, the modulation circuit 260 may narrow down the pulse width of the target signal CK1 to generate the modulated target signal CK2 having a pulse width narrower than that of the target signal CK1. Since the pulse width of the modulated target signal CK2 is narrower than that of the target signal CK1, the replica circuit 270 actually operates in a tighter condition than the functional circuit 210. In the embodiments of the invention, the tighter condition may be utilized to detect whether an error caused by duty cycle degradation is about to or possibly to occur in the functional circuit 210. When the duty margin or duty cycle of the modulated target signal CK2 is insufficient for the replica circuit 270 to function correctly, the second output signal Q2 generated by the replica circuit 270 may have an erroneous waveform, thereby whether an error caused by duty cycle degradation is about to or possibly to occur for the functional circuit 210 can be detected. When it is detected that an error caused by duty cycle degradation is about to or possibly to occur, the duty margin or duty cycle will be adjusted by the control circuit 230 in advance, so as to avoid function failure of the functional circuit caused by duty cycle degradation and/or avoid the error to actually occur.

According to an embodiment of the invention, the error detection circuit 280 is coupled to the functional circuit 210 and the replica circuit 270 to receive the first output signal Q1 and the second output signal Q2 and arranged to generate an error detection result according to the first output signal Q1 and the second output signal Q2.

According to an embodiment of the invention, the error detection result may be an error detection signal having a default signal level that is utilized to indicate an errorless condition and a predetermined signal level that is utilized to indicate a detected error. For example, a high voltage level may be set or an error flag may be asserted in the error detection signal when an error has been detected by the error detection circuit 280. For easy understanding, the label Err_Flag is given to the error detection result or the error detection signal outputted by the error detection circuit 280.

According to an embodiment of the invention, the error detection circuit 280 may be arranged to compare a difference between the first output signal Q1 and the second output signal Q2 to generate the error detection signal Err_Flag. For instance, in the embodiment where the functional circuit 210 is arranged to perform data sampling on the input data signal Data_in in response to the target signal CK1 to generate the first output signal Q1 and the replica circuit 270 is arranged to perform data sampling on the same input data signal Data_in in response to the modulated target signal CK2 to generate the second output signal Q2, the error detection circuit 280 may be designed to detect whether the second output signal Q2 has the same value as the first output signal Q1 and accordingly generate the error detection signal Err_Flag. According to an embodiment of the invention, the error detection circuit 280 may be implemented as or comprise an exclusive OR (XOR) gate.

The error detection signal Err_Flag is further provided to the control circuit 230. The control circuit 230 is arranged to control the duty margin (or, in some embodiments, the duty cycle) of the target signal based on the error detection signal Err_Flag. For example, when the control circuit 230 detects that an error flag is asserted in the error detection signal Err_Flag (or, when the error detection signal Err_Flag is set to the predetermined signal level), the control circuit 230 adjusts the duty margin of the target signal. In an embodiment of the invention, the control circuit 230 may extend or increase the duty margin or the duty cycle of the target signal, since the error detection result indicates that the duty margin or duty cycle of the modulated target signal CK2 is insufficient.

Figure 3:
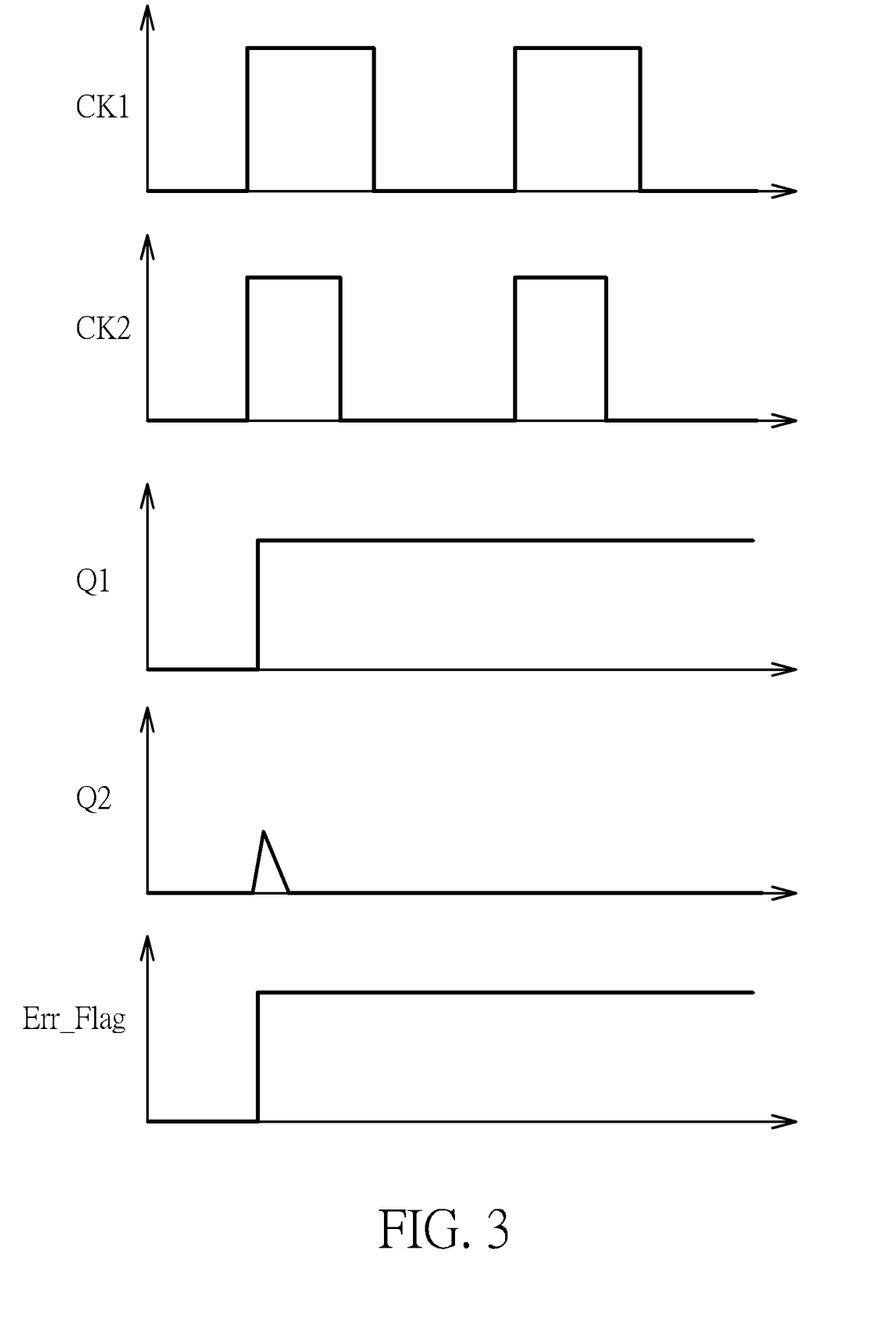
FIG. 3 shows exemplary waveforms of the target signal, the modulated target signal, the first output signal, the second output signal and the error detection signal according to an embodiment of the invention.

FIG. 3 shows exemplary waveforms of the target signal CK1, the modulated target signal CK2, the first output signal Q1, the second output signal Q2 and the error detection signal Err_Flag according to an embodiment of the invention. The modulated target signal CK2 has a narrower pulse width than the target signal CK1. The difference between the pulse width of the target signal CK1 and the pulse width of the modulated target signal CK2 may be regarded as a reserved margin. In the embodiment of the invention, when the duty margin or duty cycle of the modulated target signal CK2 is sufficient for the replica circuit 270 to function correctly, the waveform of the second output signal Q2 should be the same as the first output signal Q1, since the replica circuit 270 performs data sampling on the same input data signal as the functional circuit 210. In the example shown in FIG. 3, the waveform of the second output signal Q2 is different from the first output signal Q1, which indicates that the duty margin or duty cycle of the modulated target signal CK2 is insufficient. When the error detection circuit 280 detects that the waveform of the second output signal Q2 is different from the first output signal Q1, the error detection circuit 280 sets the error flag in the error detection signal Err_Flag. In this manner, the control circuit 230 may adjust the duty margin of the target signal in response to the error detection signal Err_Flag.

Figure 4:
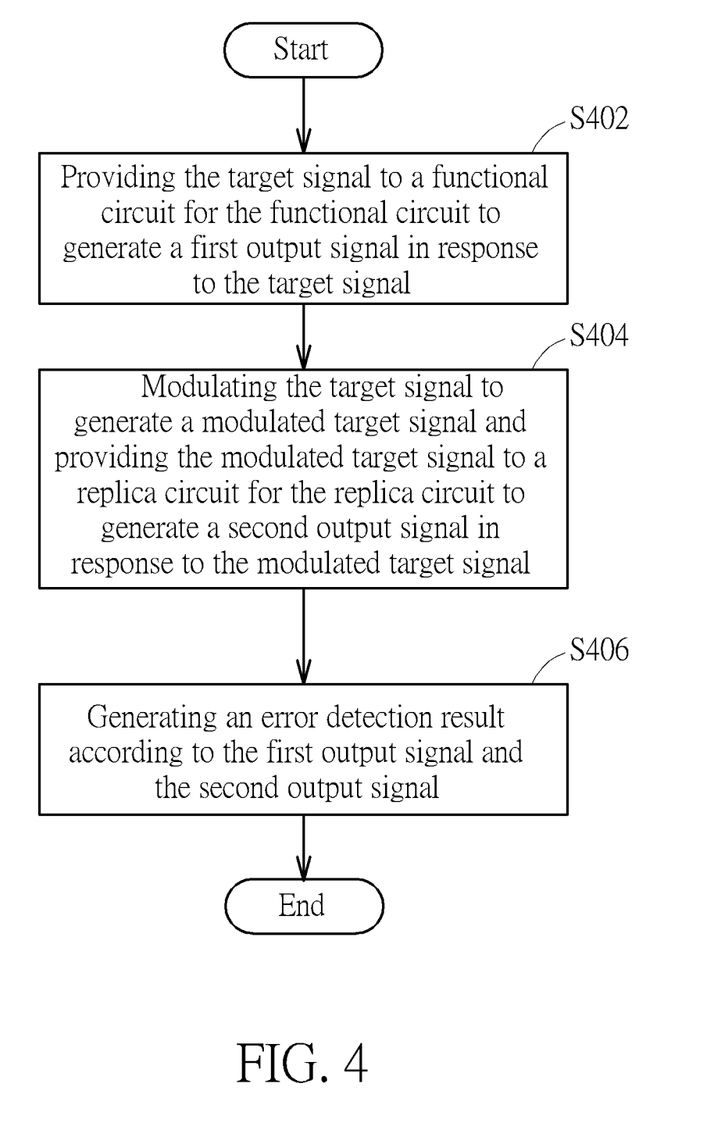
FIG. 4 shows a flow chart of a method for monitoring a duty margin of a target signal according to an embodiment of the invention.

FIG. 4 shows a flow chart of a method for monitoring a duty margin of a target signal according to an embodiment of the invention. The method for monitoring a duty margin of the target signal may be performed by a duty margin monitoring circuit, such as the duty margin monitoring circuit 220 introduced above, or a circuit comprising a duty margin monitoring circuit, such as the circuit 200 introduced above, and may comprise the following steps:

Step S402: Providing the target signal to be monitored to a functional circuit, such as the functional circuit 210 introduced above, for the functional circuit to generate a first output signal in response to the target signal.

Step S404: Modulating the target signal to generate a modulated target signal and providing the modulated target signal to a replica circuit, such as the replica circuit 270 introduced above, for the replica circuit to generate a second output signal in response to the modulated target signal. In the embodiments of the invention, the replica circuit is a replica of the functional circuit.

Step S406: Comparing the first output signal and the second output signal and accordingly generating an error detection result according to the first output signal and the second output signal.

According to an embodiment of the invention, the first output signal may be a result of data sampling which is performed by the functional circuit in response to the target signal and the second output signal may be a result of data sampling which is performed by the replica circuit in response to the modulated target signal. In addition, the comparison in step S406 may be performed by comparing a difference between the first output signal and the second output signal or detecting whether the second output signal has the same value or the same waveform as the first output signal.

In addition, in some embodiment of the invention, the method for monitoring a duty margin of the target signal may further comprise the step of providing the error detection result to a control circuit, such as the control circuit 230 introduced above, for the control circuit to control or adjust the duty margin of the target signal based on the error detection result.

Figure 5:
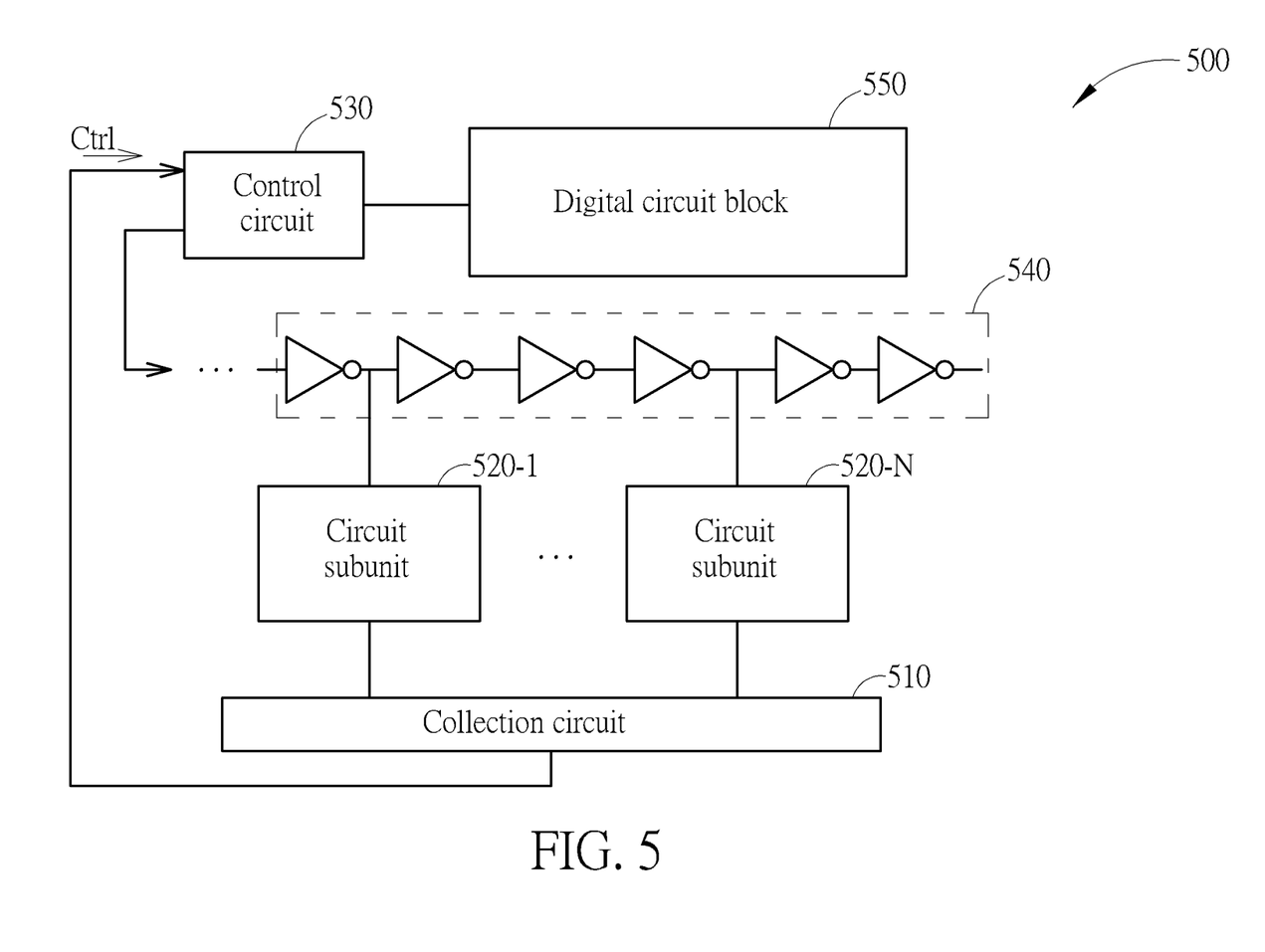
FIG. 5 shows an exemplary block diagram of a circuit for monitoring and controlling the duty margin of a signal according to another embodiment of the invention.

FIG. 5 shows an exemplary block diagram of a circuit for monitoring and controlling the duty margin of a signal according to another embodiment of the invention. The circuit 500 may at least comprise a plurality of circuit subunits 520-1~520-N, a collection circuit 510 and a control circuit 530, where N is a positive integer greater than 1. In the embodiment of the invention, the circuit 500 is designed to monitor and control the duty margin of a target signal, where the duty margin monitoring circuit in the circuit subunits is arranged to monitor the duty margin of the target signal by monitoring the signal output by the functional circuit in the circuit subunits and the control circuit 530 is arranged to control the duty margin (or, in some embodiments, the duty cycle) of the target signal and provide the target signal to a delay chain 540 and a subsequent digital circuit block 550. According to an embodiment of the invention, the target signal may be a pulse signal comprising only one or at least one pulse, or may be a clock signal comprising a plurality of consecutive pulses.

In the embodiment of the invention, each circuit subunit may comprise a functional circuit, such as the functional circuit 210 shown in FIG. 2, arranged to receive the target signal and generate a first output signal in response to the target signal and a duty margin monitoring circuit, such as the duty margin monitoring circuit 220 shown in FIG. 2, coupled to the functional circuit and arranged to monitor the duty margin of the target signal according to the first output signal to generate an error detection result.

According to an embodiment of the invention, the functional circuits in the circuit subunits 520-1~520-N may receive the target signal generated by the control circuit 530 with the same or different amounts of delay from the delay chain 540. In this manner, the duty margin monitoring circuit in each circuit subunit may monitor the duty margin of the target signal from different delay points.

According to an embodiment of the invention, the duty margin monitoring circuit in each circuit subunit may comprise a modulation circuit, such as the modulation circuit 260 shown in FIG. 2, arranged to receive the target signal and modulate the target signal to generate a modulated target signal. According to an embodiment of the invention, the modulation circuit in each circuit subunit may modulate the target signal by adjusting a pulse width of the target signal as discussed above. For example, in an embodiment of the invention, the modulation circuit may narrow down the pulse width of the target signal to generate the modulated target signal having a pulse width narrower than that of the target signal.

In addition, according to an embodiment of the invention, the duty margin monitoring circuit in each circuit subunit may further comprise a replica circuit, such as the replica circuit 270 shown in FIG. 2, which is a replica of the functional circuit and arranged to receive the modulated target signal and generate a second output signal in response to the modulated target signal. According to an embodiment of the invention, when the functional circuit is arranged to receive an input data signal and perform data sampling on the input data signal in response to the target signal to generate the first output signal, the replica circuit is arranged to receive the same input data signal and perform the same data sampling on the input data signal in response to the modulated target signal to generate the second output signal.

In addition, according to an embodiment of the invention, the duty margin monitoring circuit in each circuit subunit may further comprise an error detection circuit, such as the error detection circuit 280 shown in FIG. 2, coupled to the functional circuit and the replica circuit to receive the first output signal and the second output signal and arranged to generate the error detection result according to the first output signal and the second output signal. For example, the error detection circuit may compare a difference between the first output signal and the second output signal to generate the error detection result. The error detection result generated by each circuit subunit may be an error detection signal having a default signal level that is utilized to indicate an errorless condition and a predetermined signal level that is utilized to indicate a detected error as discussed above. For example, a high voltage level may be set or an error flag may be asserted in the error detection signal when an error has been detected.

The collection circuit 510 is coupled to the circuit subunits 520-1~520-N and arranged to collect the error detection results (e.g., the error detection signals) generated by the circuit subunits 520-1~520-N and generate a control signal Ctrl according to the error detection results (e.g., the error detection signals). According to an embodiment of the invention, the collection circuit 510 may be an OR tree circuit comprising one or a plurality of OR gates, and arranged to perform logical OR operations on the error detection results (e.g., the error detection signals) output by the circuit subunits 520-1~520-N to generate the control signal Ctrl. For example, when a high voltage level or an error flag is set in any error detection signal, the level of the control signal Ctrl may be set to the high voltage level as well, so as to indicate that controlling or adjusting the duty margin (or, in some embodiments, the duty cycle) of the target signal is required.

The control circuit 530 is coupled to the collection circuit 510 and arranged to adjust the duty margin (or, in some embodiments, the duty cycle) of the target signal according to the control signal Ctrl. For example, when the control circuit 530 detects that the control signal Ctrl is set to the high voltage level (or, an error flag is asserted in the control signal Ctrl), the control circuit 530 adjusts the duty margin of the target signal. In an embodiment of the invention, the control circuit 530 may extend or increase the duty margin or the duty cycle of the target signal, since the high voltage level or the error flag asserted in the control signal Ctrl indicates that the duty margin or duty cycle of the modulated target signal is insufficient.

Figure 6:
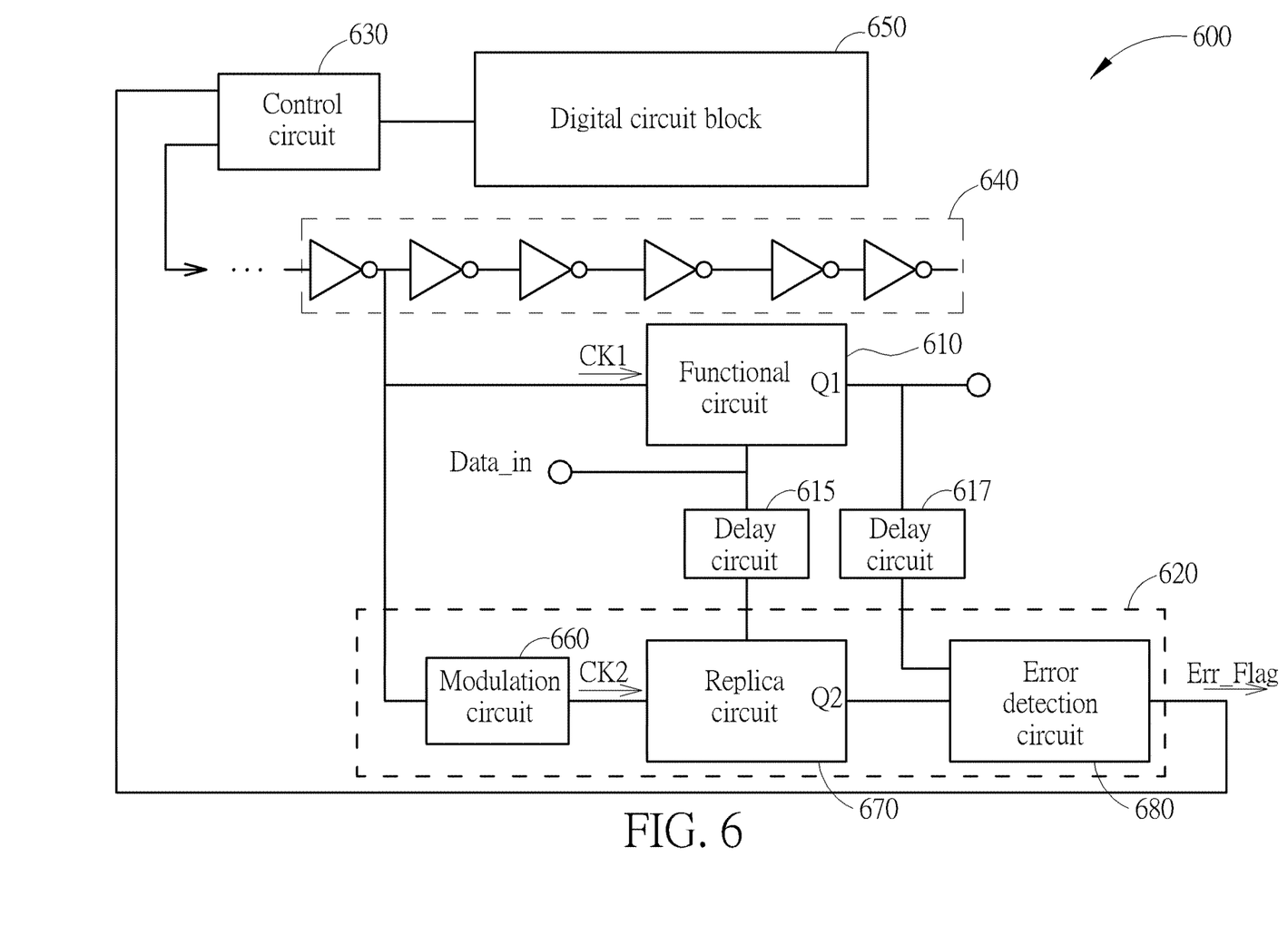
FIG. 6 shows an exemplary block diagram of a circuit for monitoring and controlling the duty margin of a signal according to yet another embodiment of the invention.

FIG. 6 shows an exemplary block diagram of a circuit for monitoring and controlling the duty margin of a signal according to yet another embodiment of the invention. The circuit 600 may at least comprise a functional circuit 610, a duty margin monitoring circuit 620 and a control circuit 630. In the embodiment of the invention, the circuit 600 is designed to monitor and control the duty margin of a target signal, where the duty margin monitoring circuit 620 is arranged to monitor the duty margin of the target signal by monitoring the signal output by the functional circuit 610 and the control circuit 630 is arranged to control the duty margin (or, in some embodiments, the duty cycle) of the target signal and provide the target signal to a delay chain 640 and a subsequent digital circuit block 650. According to an embodiment of the invention, the target signal may be a pulse signal comprising only one or at least one pulse, or may be a clock signal comprising a plurality of consecutive pulses.

The functional circuit 610 may receive the target signal, which may be a delayed version of the original target signal output by the control circuit 630, from the delay chain 640 and arranged to generate an output signal (e.g., a first output signal) in response to the target signal. The duty margin monitoring circuit 620 may comprise a modulation circuit 660, a replica circuit 670 and an error detection circuit 680. The modulation circuit 660 is arranged to receive the target signal and modulate the target signal to generate a modulated target signal. The replica circuit 670 is arranged to receive the modulated target signal and generate a second output signal in response to the modulated target signal. The error detection circuit 680 is coupled to the functional circuit 610 and the replica circuit 670 to receive the first output signal and the second output signal and arranged to generate an error detection result according to the first output signal and the second output signal. It is to be noted that the circuit 600 has a similar structure and functions in a similar way as the circuit 200 shown in FIG. 2. Therefore, the detailed descriptions of the circuit 600 may refer to descriptions of FIG. 2, where like numbers refer to like elements.

Different from the embodiment shown in FIG. 2, in the embodiment shown in FIG. 6, the circuit 600 may further comprise a delay circuit 615 coupled to the replica circuit 670 for delaying the input data signal Data_in provided to the replica circuit 670 and a delay circuit 617 coupled to an output terminal of the functional circuit 610 for delaying the first output signal generated by the functional circuit 610. In the embodiments of the invention, the amount of delay applied by the delay circuits 615 and 617 are adjustable, so that the timing of the first output signal and the second output signal may be further fine-tuned before being provided to the error detection circuit 680.

Figure 7:
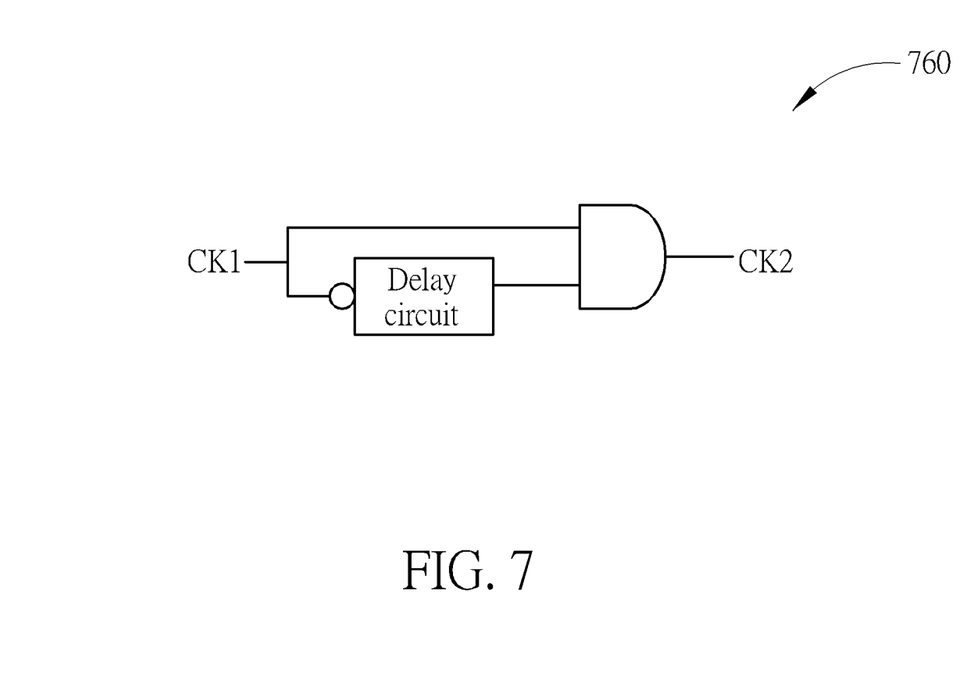
FIG. 7 shows an exemplary circuit diagram of a modulation circuit according to an embodiment of the invention.

FIG. 7 shows an exemplary circuit diagram of a modulation circuit according to an embodiment of the invention. In an embodiment of the invention, the modulation circuit 760 may comprise an inverter, a delay circuit and a logical gate, such as an AND gate. The modulation circuit 760 may perform the logical operation, such as the logical AND operation, on the target signal CK1 and an inverted and delayed version of the target signal CK1 to generate the modulated target signal CK2, where the amount of delay may be determined based on reserved margin to be monitored. It is to be noted that FIG. 7 shows only an exemplary circuit of a modulation circuit, and the invention should not be limited thereto.

In summary, as described above, the pulse width of the modulated target signal CK2 generated by the modulation circuit will be narrower than that of the target signal CK1, so as to create a tighter condition for the replica circuit as a comparison. In this manner, by monitoring duty margin of the target signal and detecting the operational difference between the functional circuit and the replica circuit as described above, for example, detecting the difference between the signals outputted by the functional circuit and the replica circuit based on the same input signal, whether an error caused by duty cycle degradation is about to or possibly to occur in the functional circuit can be detected. When it is detected that an error caused by duty cycle degradation is about to or possibly to occur, the duty margin or duty cycle will be adjusted by the control circuit in advance, so as to avoid function failure of the functional circuit caused by duty cycle degradation and/or avoid the error to actually occur.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A duty margin monitoring circuit, coupled to a functional circuit which generates a first output signal in response to a target signal, comprising:
   a modulation circuit, arranged to receive the target signal and modulate the target signal to generate a modulated target signal;
   a replica circuit, arranged to receive the modulated target signal and generate a second output signal in response to the modulated target signal; and
   an error detection circuit, coupled to the functional circuit and the replica circuit to receive the first output signal and the second output signal and arranged to generate an error detection result according to the first output signal and the second output signal.

2. The duty margin monitoring circuit of claim 1, wherein the replica circuit is a replica of the functional circuit.

3. The duty margin monitoring circuit of claim 1, wherein the target signal is a pulse signal or a clock signal.

4. The duty margin monitoring circuit of claim 1, wherein the modulation circuit modulates the target signal by adjusting a pulse width of the target signal.

5. The duty margin monitoring circuit of claim 4, wherein a pulse width of the modulated target signal is narrower than the pulse width of the target signal.

6. The duty margin monitoring circuit of claim 1, wherein the replica circuit is further arranged to receive an input data signal and perform data sampling on the input data signal in response to the modulated target signal to generate the second output signal, and wherein the error detection circuit is arranged to compare a difference between the first output signal and the second output signal to generate the error detection result.

7. A method for monitoring a duty margin of a target signal comprising:
   providing the target signal to a functional circuit for the functional circuit to generate a first output signal in response to the target signal;
   modulating the target signal to generate a modulated target signal and providing the modulated target signal to a replica circuit for the replica circuit to generate a second output signal in response to the modulated target signal, wherein the replica circuit is a replica of the functional circuit; and
   generating an error detection result according to the first output signal and the second output signal.

8. The method of claim 7, wherein the target signal is a pulse signal or a clock signal.

9. The method of claim 7, wherein modulation of the target signal is performed by adjusting a pulse width of the target signal.

10. The method of claim 9, wherein a pulse width of the modulated target signal is narrower than the pulse width of the target signal.

11. The method of claim 7, wherein step of generating the error detection result according to the first output signal and the second output signal further comprises:
   comparing a difference between the first output signal and the second output signal to generate the error detection result,
   wherein the first output signal is a result of data sampling that is performed by the functional circuit in response to the target signal and the second output signal is a result of data sampling that is performed by the replica circuit in response to the modulated target signal.

12. The method of claim 7, further comprising:
   providing the error detection result to a control circuit to control the duty margin of the target signal.

13. A circuit for monitoring and controlling a duty margin of a target signal, comprising:
   a plurality of circuit subunits, each comprising:
      a functional circuit, arranged to receive the target signal and generate a first output signal in response to the target signal; and
      a duty margin monitoring circuit, coupled to the functional circuit and arranged to monitor the duty margin of the target signal according to the first output signal to generate an error detection result;
   a collection circuit, coupled to the circuit subunits and arranged to collect the error detection results and generate a control signal according to the error detection results; and
   a control circuit, coupled to the collection circuit and arranged to adjust the duty margin of the target signal according to the control signal.

14. The circuit of claim 13, wherein the duty margin monitoring circuit further comprises:
   a modulation circuit, arranged to receive the target signal and modulate the target signal to generate a modulated target signal;
   a replica circuit, arranged to receive the modulated target signal and generate a second output signal in response to the modulated target signal; and
   an error detection circuit, coupled to the functional circuit and the replica circuit to receive the first output signal and the second output signal and arranged to generate the error detection result according to the first output signal and the second output signal.

15. The circuit of claim 13, wherein the target signal is a pulse signal or a clock signal.

16. The circuit of claim 14, wherein the replica circuit is a replica of the functional circuit.

17. The circuit of claim 14, wherein the modulation circuit modulates the target signal by adjusting a pulse width of the target signal.

18. The circuit of claim 17, wherein a pulse width of the modulated target signal is narrower than the pulse width of the target signal.

19. The circuit of claim 14, wherein the functional circuit is further arranged to receive an input data signal and perform data sampling on the input data signal in response to the target signal to generate the first output signal and the replica circuit is further arranged to receive the input data signal and perform data sampling on the input data signal in response to the modulated target signal to generate the second output signal.

20. The circuit of claim 19, wherein the error detection circuit is arranged to compare a difference between the first output signal and the second output signal to generate the error detection result.

* * * * *